United States Patent [19]

Joyce

[11] 4,032,389
[45] June 28, 1977

[54] APPARATUS FOR AUTOMATICALLY CONTROLLING CRYSTAL GROWTH

[75] Inventor: Gordon Charles Joyce, Malvern, England

[73] Assignee: National Research Development Corporation, London, England

[22] Filed: Mar. 31, 1975

[21] Appl. No.: 563,443

[30] Foreign Application Priority Data

Mar. 29, 1974   United Kingdom ............ 14167/74

[52] U.S. Cl. ........................... 156/601; 23/273 SP; 219/10.77
[51] Int. Cl.² ..................... B01J 17/18; H05B 5/06
[58] Field of Search ............... 23/273 SP; 156/601; 219/10.77

[56] References Cited

UNITED STATES PATENTS

| | | | |
|---|---|---|---|
| 2,908,004 | 10/1959 | Levinson ........................... | 156/601 |
| 3,136,876 | 6/1964 | Crosthwait ..................... | 219/10.77 |
| 3,284,172 | 11/1966 | Binder ............................... | 156/601 |
| 3,621,213 | 11/1971 | Jen et al. ............................ | 156/601 |
| 3,692,499 | 9/1972 | Andrychuk ........................ | 156/601 |
| 3,934,983 | 1/1976 | Bardsley et al. ................... | 156/601 |

OTHER PUBLICATIONS

Automated Crystal Puller, Kyle et al., Mat. Res. Bull., vol. 8, No. 4, (April, 1973), pp. 443–450, Pergamon Press, Inc.

*Primary Examiner*—Wilbur L. Bascomb, Jr.
*Assistant Examiner*—Barry I. Hollander
*Attorney, Agent, or Firm*—Cushman, Darby & Cushman

[57] ABSTRACT

Automatic control of the growth from the melt of a crystal in the Czochralski technique by weighing the crystal, comparing the weight with its expected value in a comparator and using the difference in a servo-loop as a servo-control signal is known. The servo-control signal modulates the melt heater power which adjusts the temperature isotherms of the melt in order to maintain the crystal cross-sectional area constant. It has been found that a thermal delay which occurs when heat is conducted from the melt crucible to the crystal/melt interface can cause the crystal cross-sectional area to depart from its uniform expected value. The effect of the thermal delay is compensated for by a phase advance circuit which is connected to the output of the servo-loop comparator.

4 Claims, 4 Drawing Figures

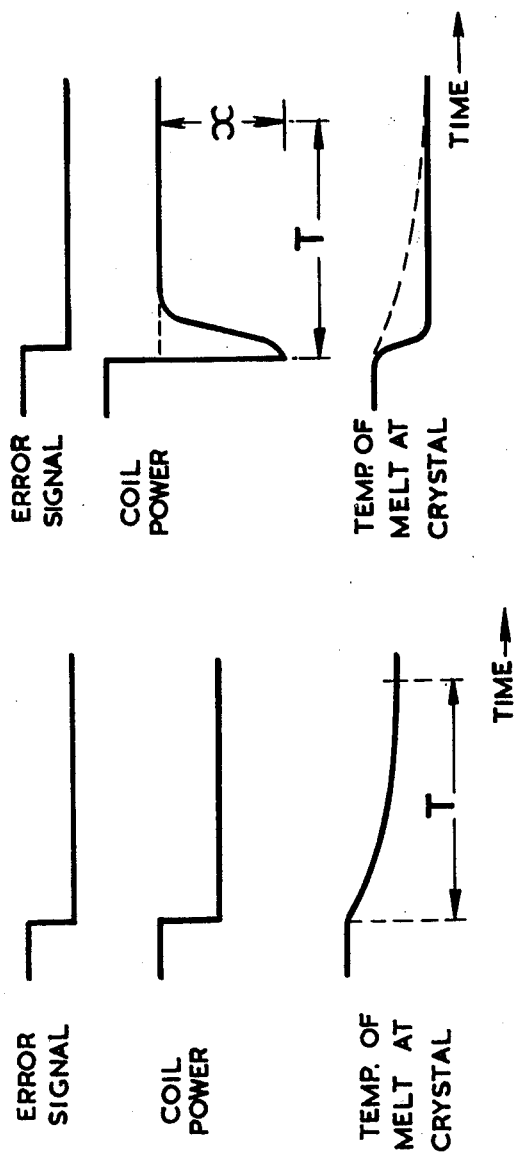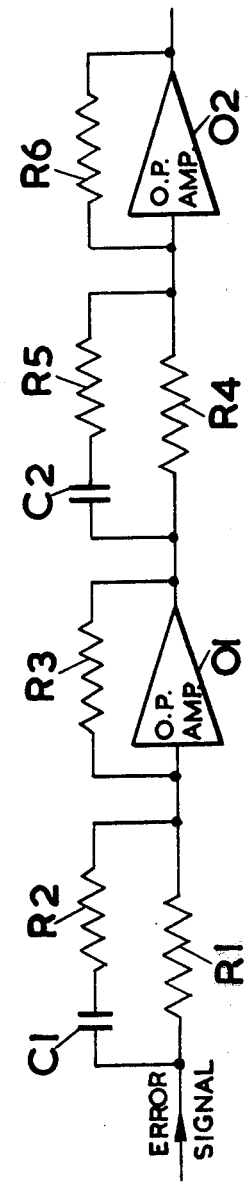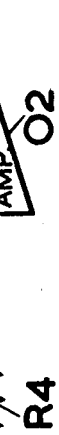

APPARATUS FOR AUTOMATICALLY CONTROLLING CRYSTAL GROWTH

The present invention relates to automatically controlled crystal growth.

A technique for growing crystals known as the pulling or Czochralski technique involves heating a material until molten in a crucible then dipping a seed crystal, attached to the lower end of a vertical pull rod, into the melt and slowly moving the rod upward to cause a crystal to grow on the seed by solidification from the melt. Since many materials grown as crystals by this technique are costly it is desirable to grow uniform crystals. This can be done by growing crystals of circular cross-section having a uniform area along the crystal length. In order to control the crystal cross-sectional area during pulling, the melt temperature can be adjusted by varying the electric current supplied to a heating oil surrounding the crucible, or by varying the speed at which the rod is raised or by varying the speed at which the rod is rotated about its own axis (if rotation of the rod is employed).

Crystal pulling often takes many hours and it is therefore desirable to control the crystal cross-sectional area automatically. In known arrangements this is done by continuously measuring the mass or weight of the crucible or pull rod and its attachments and deriving from the measurement a weight signal representing a change in weight of the crystal. The weight signal is either compared with its expected value or differentiated and compared with a constant equal to the expected value of its differential. Any difference or error signal produced by the comparison is fed in a feed-back loop to control the power supplied to heat the melt whereby the temperature of the melt is adjusted to correct for the departure of the cross-sectional area from its uniform expected value. U.S. Pat. No. 3,934,983 describes one example of such an arrangement.

For the purpose of generality an automatically controlled crystal growth arrangement will be referred to herein as an arrangement' of the kind described' if it includes a crucible for containing a crystallisable material, means for heating the crucible to provide a melt of the material, means for pulling a crystal from the melt, a monitor for monitoring a property of the crystal to detect when the cross-sectional area of the crystal departs from a uniform expected value, and a feedback loop comprising a reference signal generator for generating a reference signal equal to the expected value of the output of the monitor for a uniform crystal cross-sectional area and a comparator for comparing the output of the monitor with the reference signal and for producing from any difference between them an error signal capable of being employed to control the temperature of the melt. The feedback loop will be referred to as a 'feed-back loop' as defined.

In an arrangement of the kind described there is always a time delay between the instant when any incremental change occurs in the crystal cross-sectional area and the instant when a correcting incremental change occurs in the temperature of the melt immediately adjacent to the growing crystal following detection of the cross-sectional area change by the monitor and corresponding response by the feedback loop. This delay, referred to herein as the "thermal delay", is basically the finite time required for heat to be conducted across the melt to the region immediately adjacent to the growing crystal. It has now been discovered that the thermal delay can cause the crystal cross-sectional area to depart considerably from its expected uniform value.

It is an object of the invention to compensate for the effect of the thermal delay in an arrangement of the kind described.

According to the present invention a feedback loop as defined for use in an arrangement of the kind described above includes means for advancing the phase of changes in the error signal produce by the compartor of the loop to compensate for the thermal delay.

The means for advancing the phase may be one or more analogue phase advance circuits.

Embodiments of the present invention will now be described by way of example with reference to the accompanying drawings, in which:

FIGS. 2a and 2b are graphical sketches illustrating the response of the crystal growth to an instantaneous step-change in error signal respectively with and without a phase advance network in the arrangement illustrated in FIG. 1.

FIG. 3 is a schematic circuit diagram of one form of phase advance network which may be used in the arrangement illustrated in FIG. 1.

Figure 1:
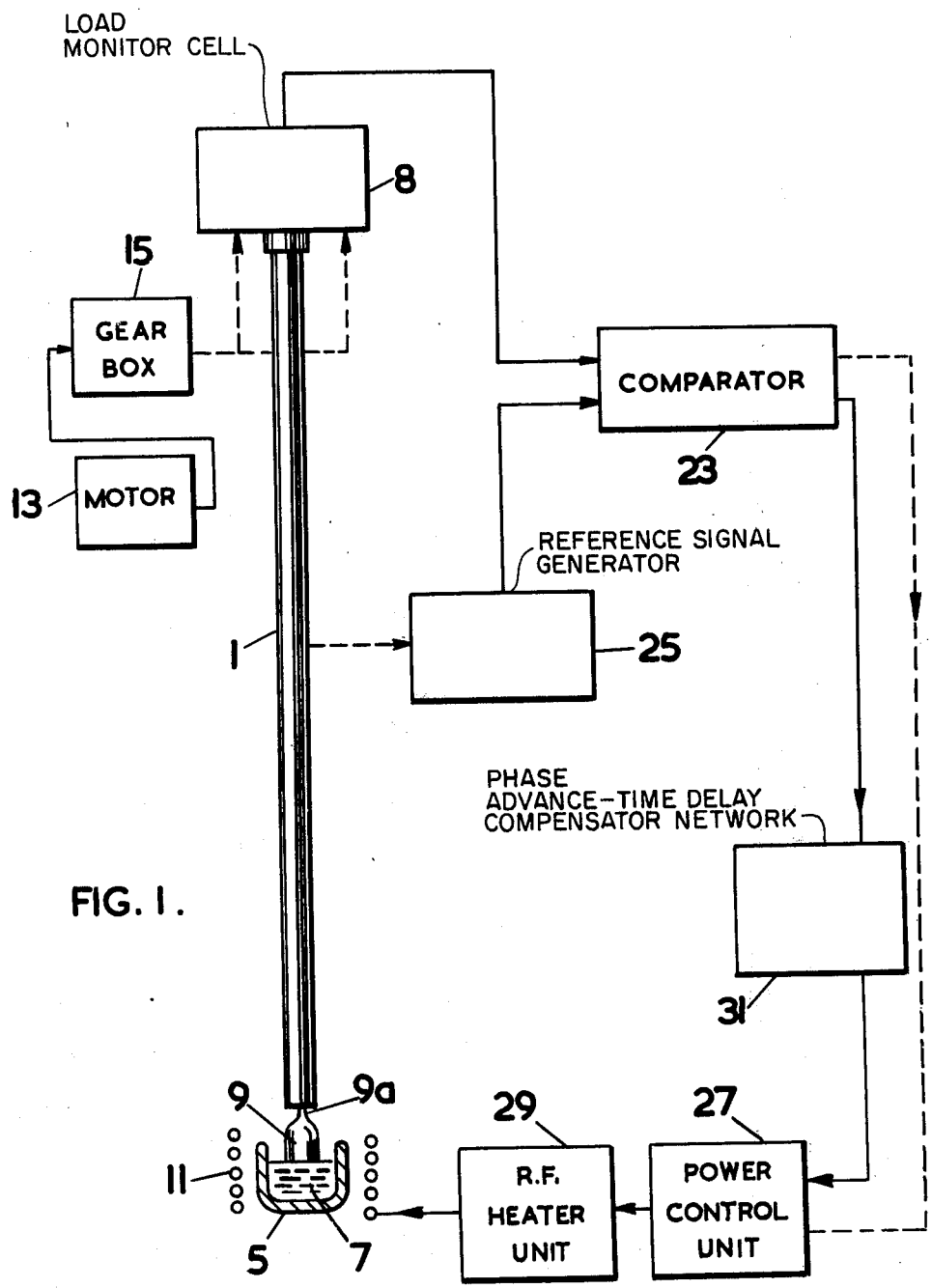
FIG. 1 is a schematic diagram of an automatically controlled crystal growth arrangement illustrating the position of a phase advance network in the arrangement.

In the arrangement shown in FIG. 1 a crucible 5 is arranged in a conventional crystal growing vessel (not shown) to be heated by an electrical induction heater coil 11 to produce a melt 7 from a charge of a material of interest. A pull rod 1 suspended from a load cell 8 carries a crystal seed 9a (attached by conventional means) which is initially dipped into the melt 7 and then slowly raised away from the melt 7 with the rod 1 allowing a single crystal 9 to grow from the melt 7. The rod 1 is raised by lifting the load cell 8 in a conventional way by a motor 13 and a gear box 15. For example the load cell 8 may rest on the nut of a lead-screw (not shown) rotated by the motor 13 through the gear box 15 as described in the said copending Application. The rod 1 is also rotated about its own axis by conventional means (not shown) also as described in the said copending Application.

The load cell 8 monitors the weight of the growing crystal 9 and produces an electrical voltage which acts as a weight signal corresponding to that weight. A position indicator 25 is arranged to measure the position of a reference point on the rod 1. The position indicator 25 produces an electrical voltage signal corresponding to the expected value at any given time of the weight of the growing crystal 9, to which expected value the change in position of the reference point on the rod 1 is proportional. Thus, if the crystal 9 is growing uniformly the output signals from the load cell 8 and the position indicator 25 are equal. However if the weight of the growing crystal 9 departs from its expected value at any given time, eg as a result of a mains voltage fluctuation, the departure is detected by a comparator 23 which produces an error signal equal to the magnitude of the difference between the outputs from the load cell 8 and the position indicator 25. The error signal is fed to a conventional power control unit 27 which controls the r.f. power supplied by a conventional r.f. heater supply unit 29 to the coil 11. Thus the error signal from the comparator 23 is added to or subtracted from (as appropriate) a fixed signal generated within the power control unit 27 to modulate the power supplied by the supply unit 29. The modulation to the r.f. power provides an adjustment to the temperature of the melt 7 which in turn adjusts the cross-sectional area of the growing crystal 9 and hence adjusts the weight of the growing crystal 9 back to its expected value as a function of time.

The weight signal provided as an output from the load cell 8 contains a fixed contribution from the weight of the pull rod 1 and its attachments if any. This fixed contribution may be balanced out by an appropriate setting of the position indicator 25. Alternatively the fixed contribution may be cancelled by applying the output of the load cell to a subtractor (not shown), where a signal equal to the fixed contribution is subtracted from the weight signal before it is applied to the comparator 23.

When the comparator 23 detects that the weight of the growing crystal 9 has departed from its expected value it is not possible for the temperature of the melt 7 immediately adjacent to the growing crystal 9 to be adjusted until the thermal delay as defined above has occurred if the error signal is applied directly to the power control unit 27, as indicated by a dashed line in FIG. 1. The cross-sectional area of the crystal 9 can depart significantly from its expected uniform value as a result as the thermal delay before the need for correction is detected. The correction of the cross-sectional area will be late and the crystal 9 will consequently be allowed to develop a series of ripples along its external surface.

However the effect of the thermal delay is compensated for by feeding the error signal produced by the comparator 23 through a phase advance network 31, as indicated by a full line, located between the comparator 23 and the power control unit 27 instead of feeding the error signal direct to the power control unit 27. The phase advance network 31 acts in the following way.

It has been found that the thermal delay $T(s)$ may satisfactorily be represented by the equation:

$$T(s) = \left(\frac{1}{1 + sT_1}\right) \cdot \left(\frac{1}{1 + sT_2}\right) \cdot \left(\frac{1}{1 + sT_3}\right) \quad \text{Equation 1}$$

where $T_1$, $T_2$, $T_3$... are constants and which may be determined from a previous calibration of the apparatus, and where s is the Laplace operator (as commonly used in Laplace transform equations in electrical engineering). The terms on the right hand side of Equation 1 may be separately compensated for be separate conventional phase advance networks arranged in sequence between the comparator 23 and the power control unit 27. However, it has been found that of the constants in Equation 1 only $T_1$ and $T_2$ are normally significant so that only two phase advance networks are normally necessary to compensate for the thermal delay $T(s)$. Two appropriate circuits constituting the network 31 of FIG. 1 are shown in detail in FIG. 3.

The first circuit, which compensates for the first term on the right hand side of Equation 1, comprises a resistor R1 in parallel with a capacitor C1 and a resistor R2, followed by an operational amplifier 01 in parallel with a resistor R3. The second circuit which compensates for the second term on the right hand side of Equation 1 comprises a resistor R4 in parallel with a capacitor C1 and a resistor R5, followed by an operational amplifier 02 in parallel with a resistor R6.

For a given input error signal voltage $V_1$ the output error signal voltage Vo from the phase advance networks 31 is given (from known theory) by the following equation:

$$\frac{V_o}{V_1} = \left(\frac{R_3}{R_1}\right) \cdot \left(\frac{1 + sC_1(R_1 + R_2)}{1 + sC_1 R_2}\right) \cdot \left(\frac{R_6}{R_4}\right) \cdot \left(\frac{1 + sC_2(R_4 + R_5)}{1 + sC_2 R_5}\right) \quad \text{Equation 2}$$

Conveniently, the values of the capacitors $C_1$ and $C_2$ and the resistors $R_1$, $R_2$, $R_3$, $R_4$, $R_5$ and $R_6$, which may be adjustable, are selected so that Equation 2 simplifies to the following:

$$\frac{V_o}{V_1} = \left(\frac{1 + sT_1}{1 + k_1 sT_1}\right) \cdot \left(\frac{1 + sT_2}{1 + k_2 sT_2}\right) \quad \text{Equation 3}$$

where $k_1$ and $k_2$ are arbitrary constants much less than unity. If Equation 3 is satisfied or roughly satisfied then the overall effect of the phase advance network 31 on the error signal $V_1$ is that now to be described with reference to FIG. 2(a).

Suppose that a small step reduction occurs in the error signal $V_1$ from the comparator 23. This step function would, if Fourier analysed, be shown to consist of a multiplicity of components of different frequencies; the phase advance network 31 advances the phase of the high frequency components. As a result the phase advance network 31 produces an overshoot x in the step change which overshoot dies away rapidly. The amplitude and the delay time of the overshoot x are determined by the constants $k_1$ and $k_2$ in Equation 3. The effect of the overshoot x is to produce a large change in the power supplied to the coil 11 to which large change the temperature of the melt 7 adjacent to the growing crystal responds rapidly as illustrated in FIG. 2(a). Thus, the weight of the growing crystal 9 is adjusted to its expected uniform value in a time much shorter than the thermal delay.

This may be contrasted with the case when the phase advance networks 31 are not included in the arrangement, as illustrated in FIG. 2(b). The change in the power supplied to the coil 11 is smaller in this case and it is not until the thermal delay time T has elapsed that the temperature of the melt adjacent to the growing crystal 9 is fully adjusted.

In another embodiment of the invention the phase advance function carried out by the phase advance networks 31 is carried out by a conventional digital circuit.

In another embodiment of the invention the inertial mass of the growing crystal 9 may be monitored and compared with its expected value. In yet another embodiment of the invention the weight of the growing crystal 9 may be monitored by weighing the crucible 5 in a known way and comparing the weight with the expected value. However in both of these embodiments the function of the phase advance network 31 (or alternative means) is the same as that hereinbefore described.

I claim:

1. Apparatus for automatically controlled crystal growth comprising:
    a container for containing a melt of crystallisable material,
    an electrical heater for heating said material to establish a melt of said material,
    means for supplying electrical power to energize said heater,
    means for pulling a crystal from said melt when established,
    a monitor arrangement for monitoring a function of a physical property of the growing crystal related to the cross-section of the crystal including means for monitoring the weight of the crystal,
    a comparator for comparing said function with its expected value to derive a control signal from any difference between said function and its expected value,
    a feedback loop from said comparator to said means for supplying power to apply said control signal to adjust said power, and
    means for advancing the phase of changes in said control signal to compensate for delay in the transfer of heat from said heater to the interface between said melt and said growing crystal.

2. Apparatus as claimed in claim 1 and wherein said means for advancing the phase comprises at least one analogue phase advance circuit.

3. Apparatus as claimed in claim 2 and wherein said means for advancing the phase comprises at least two phase advance circuits together forming a phase advance network, each circuit comprising an operational amplifier having an input terminal and an output terminal, and a parallel combination of a first resistor and a capacitor and a second resistor connected in series with said capacitor, said parallel combination being connected to said operational amplifier.

4. Apparatus as claimed in claim 1 wherein said pulling means including a pull rod and said monitor arrangement includes a weighing cell arranged so as to weigh said pull rod with said crystal attached for determination of the weight of said crystal.

* * * * *